United States Patent
Straaijer (10) Patent No.: US 7,158,211 B2
(45) Date of Patent: Jan. 2, 2007

(54) LITHOGRAPHIC APPARATUS AND DEVICE MANUFACTURING METHOD

(75) Inventor: Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 120 days.

(21) Appl. No.: 10/946,340

(22) Filed: Sep. 22, 2004

(65) Prior Publication Data

US 2005/0259236 A1 Nov. 24, 2005

(30) Foreign Application Priority Data

Sep. 29, 2003 (EP) .................................. 03256094

(51) Int. Cl.
G03B 27/42 (2006.01)
G03B 27/52 (2006.01)
G03B 27/60 (2006.01)
B25B 11/00 (2006.01)

(52) U.S. Cl. ............................ 355/53; 355/30; 355/73; 269/21

(58) Field of Classification Search ................ 355/30, 355/53, 72, 73, 91; 269/21; 361/679, 689, 361/698, 699
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ........................ 95/44 |
| 4,346,164 A | 8/1982 | Tabarelli et al. ............ 430/311 |
| 4,390,273 A | 6/1983 | Loebach et al. ............ 355/125 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. |
| 5,040,020 A | 8/1991 | Rauschenbach et al. ...... 355/53 |
| 5,088,006 A * | 2/1992 | del Puerto et al. .......... 361/699 |
| 5,203,401 A | 4/1993 | Hamburgen et al. |
| 5,610,683 A | 3/1997 | Takahashi ..................... 355/53 |
| 5,715,039 A | 2/1998 | Fukuda et al. ................ 355/53 |
| 5,825,043 A | 10/1998 | Suwa .......................... 250/548 |
| 5,900,354 A | 5/1999 | Batchelder ................... 430/395 |
| 6,191,429 B1 | 2/2001 | Suwa |
| 6,236,634 B1 | 5/2001 | Lee et al. .................... 369/112 |
| 6,560,032 B1 | 5/2003 | Hatano ........................ 359/656 |
| 6,600,547 B1 | 7/2003 | Watson et al. |
| 6,603,130 B1 | 8/2003 | Bisschops et al. ........ 250/492.1 |
| 6,633,365 B1 | 10/2003 | Suenaga ....................... 355/53 |
| 2002/0020821 A1 | 2/2002 | Van Santen et al. ......... 250/492 |
| 2002/0163629 A1 | 11/2002 | Switkes et al. ............... 355/53 |

(Continued)

FOREIGN PATENT DOCUMENTS

DE 206 607 2/1984

(Continued)

OTHER PUBLICATIONS

EP Search Report For European Application No. 03256094.8, dated Jul. 8, 2004.

(Continued)

*Primary Examiner*—Alan Mathews
(74) *Attorney, Agent, or Firm*—Pillsbury Winthrop Shaw Pittman LLP (57) ABSTRACT

A table configured to support a substrate has one or more projections which support the substrate. In an embodiment, the table also has a raised perimeter defining a space which is configured to be filled with a liquid. A pump is configured to remove liquid from the space via outlet passages to an optional inlet. The removal of liquid can create a pressure differential across the substrate which then clamps it in place. Liquid circulated to the inlet may be filtered by a filter to remove contaminants.

22 Claims, 4 Drawing Sheets

U.S. PATENT DOCUMENTS

| | | | |
|---|---|---|---|
| 2003/0123040 A1 | 7/2003 | Almogy ........................ | 355/69 |
| 2003/0174408 A1 | 9/2003 | Rostalski et al. ........... | 359/642 |
| 2004/0000627 A1 | 1/2004 | Schuster | |
| 2004/0021844 A1 | 2/2004 | Suenaga | |
| 2004/0075895 A1 | 4/2004 | Lin ............................ | 359/380 |
| 2004/0109237 A1 | 6/2004 | Epple et al. | |
| 2004/0114117 A1 | 6/2004 | Bleeker | |
| 2004/0119954 A1 | 6/2004 | Kawashima et al. .......... | 355/30 |
| 2004/0125351 A1 | 7/2004 | Krautschik ................... | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 511 928 A1 | 11/1992 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

U.S. Appl. No. 10/814,815, filed Apr. 1, 2004, Zaal et al.
U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/719,683, filed Nov. 24, 2003, Streefkerk et al.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B ., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "⅛ μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibilty of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coeffiecient in nonparaxial λ/NA scaling equations for resolution, depth of focus and immersion lithography, *J. Microlith., Microfab., Microsyst.* 1(1):7-12 (2002).

* cited by examiner

LITHOGRAPHIC APPARATUS AND DEVICE MANUFACTURING METHOD

This application claims priority from European patent application EP 03256094.8, filed Sep. 29, 2003, which is incorporated herein in its entirety.

FIELD OF THE INVENTION

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
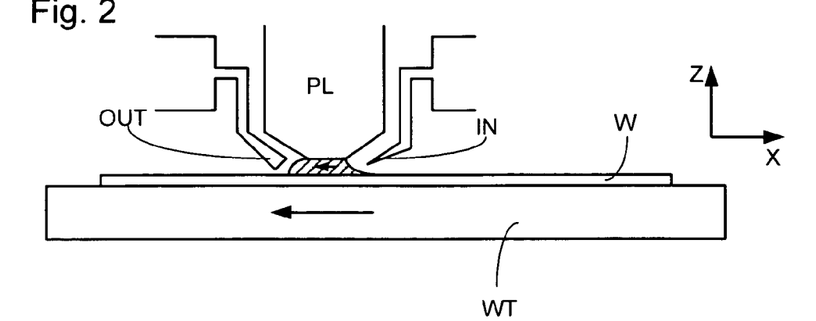
FIGS. 2 and 3 depict a liquid supply system for use in a lithographic projection apparatus.
Figure 3:
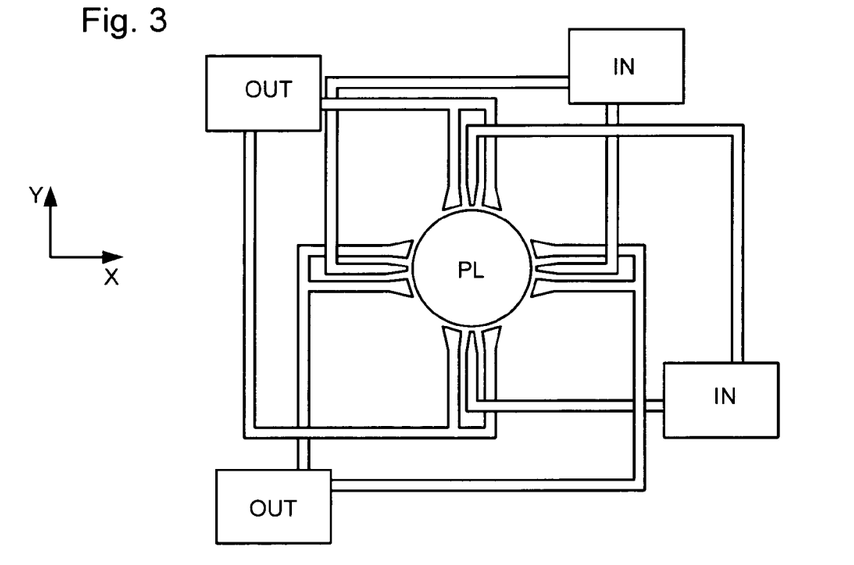

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

During processing of a substrate, the substrate needs to be held securely on its carrier. In a conventional apparatus, the substrate is typically held on the carrier by gas pressure. The substrate is mounted on a chuck which contains a number of passages to which a vacuum system or low pressure source is attached. The substrate is clamped on to the carrier by the action of gas pressure when the vacuum or low pressure system is operational.

However, a conventional system such as this may not be suitable for apparatus in which the substrate is immersed in liquid. In an immersion lithography apparatus, gas pressure clamping may not be suitable because liquid may be drawn into the vacuum or low pressure pumping system causing problems with clamping.

SUMMARY

Accordingly, it would be advantageous, for example, to provide a clamping system which operates effectively despite the presence of a liquid.

According to an aspect of the invention, there is provided a lithographic apparatus arranged to transfer a pattern from a patterning device onto a substrate, comprising:

a table having a clamping surface, the clamping surface having one or more projections configured to support the substrate when clamped thereto; and a pump configured to pump a liquid through a space between the clamping surface and the substrate, so that when liquid is pumped through the space, the liquid in the space is at a lower pressure that a fluid on an other side of the substrate such that a net force is exerted on the substrate to hold it on the clamping surface.

According to another aspect of the invention, there is provided a device manufacturing method comprising transferring a pattern from a patterning device onto a substrate, wherein the substrate is held on a clamping surface of a table by providing a liquid in the space between the substrate and the clamping surface that is at a lower pressure than a fluid on an other side of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
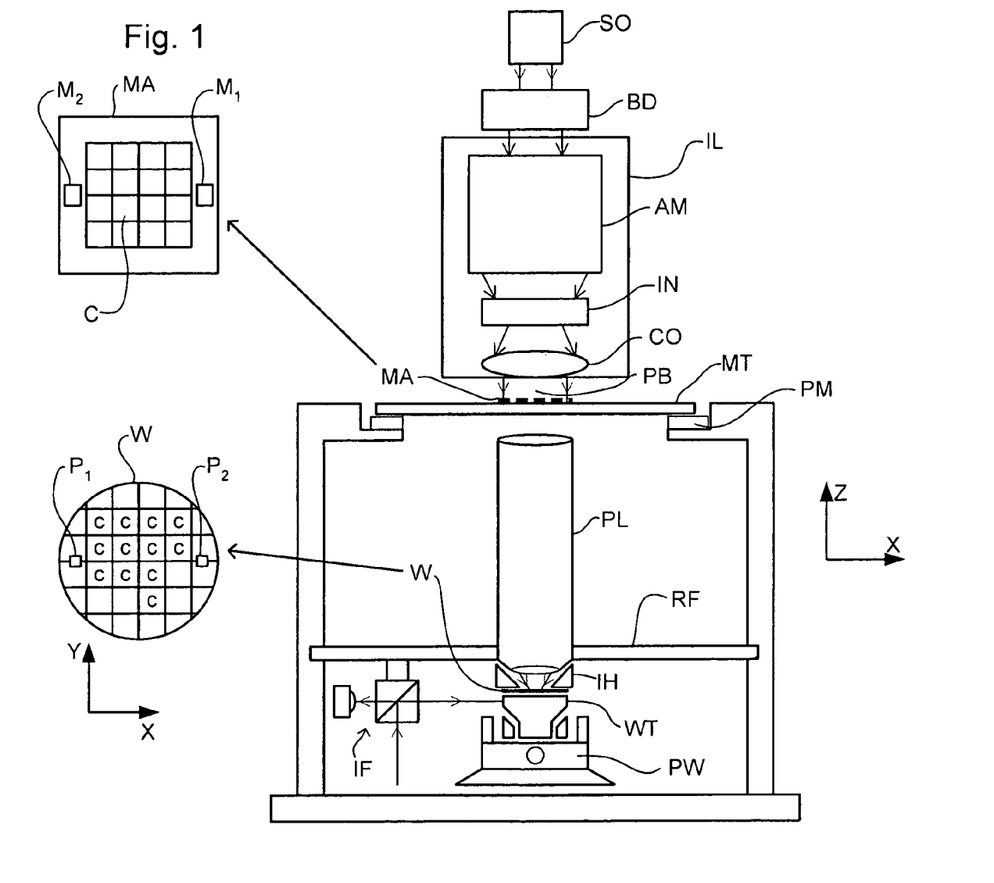
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an immersion implementation of the lithographic apparatus depicted in FIG. 1, a liquid supply system IH is provided. The liquid supply system IH may be of any type including, without limitation, any of the types of liquid supply systems described herein.

Figure 4:
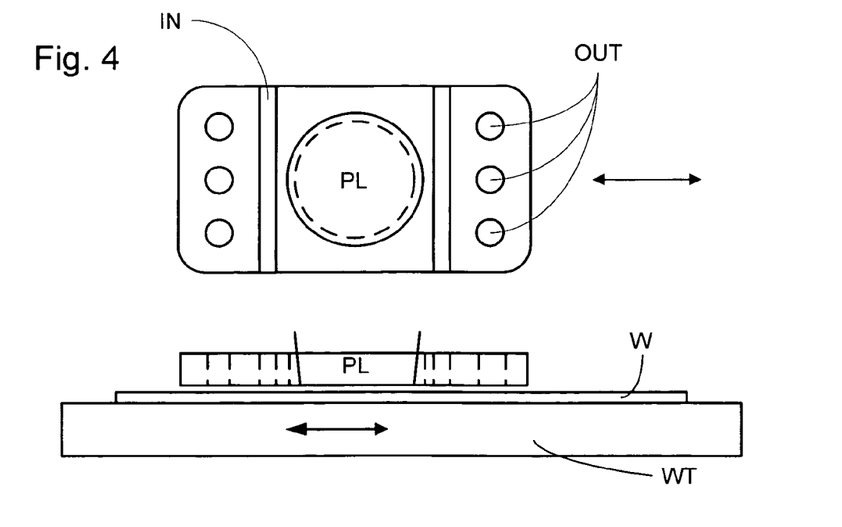
FIG. 4 depicts another liquid supply system for use in a lithographic projection apparatus.

In addition to the liquid supply system described above, a further immersion lithography solution with a localized liquid supply system may be used as shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion solution which has been proposed is to provide a liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in United States patent application U.S. Ser. No. 10/705,783, hereby incorporated in its entirety by reference, and shown in FIG. 5.

Figure 5:
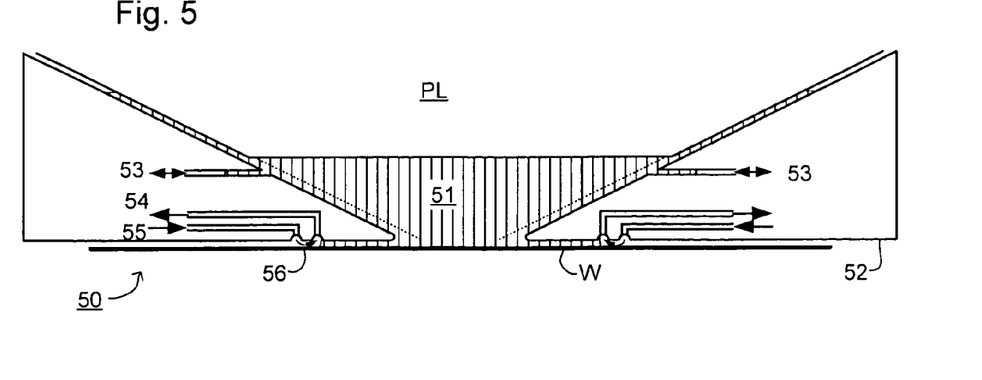
FIG. 5 depicts a further liquid supply system for use in a lithographic projection apparatus.

The reservoir 50 forms a contactless seal to the substrate around the image field of the projection system so that liquid is confined to fill a space between the substrate surface and the final element of the projection system. The reservoir is formed by a seal member 52 positioned below and surrounding the final element of the projection system PL. Liquid is brought into the space below the projection system via passage 53 and within the seal member 52. Liquid may also be removed from the space via passage 53. The seal member 52 extends a little above the final element of the projection system and the liquid level rises above the final element so that a buffer of liquid is provided. The seal member 52 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 56 between the bottom of the seal member 52 and the surface of the substrate W. The gas seal is formed by gas, e.g. air or synthetic air but, in an embodiment, $N_2$ or another inert gas, provided under pressure via inlet 55 to the gap between seal member 52 and substrate W and extracted via first outlet 54. The overpressure on the gas inlet 55, vacuum level on the first outlet 54 and geometry of the gap are arranged so that there is a high-velocity gas flow inwards that confines the liquid.

In European Patent Application No. 03257072.3 the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus has only one table movable between first and second positions.

Figure 6:
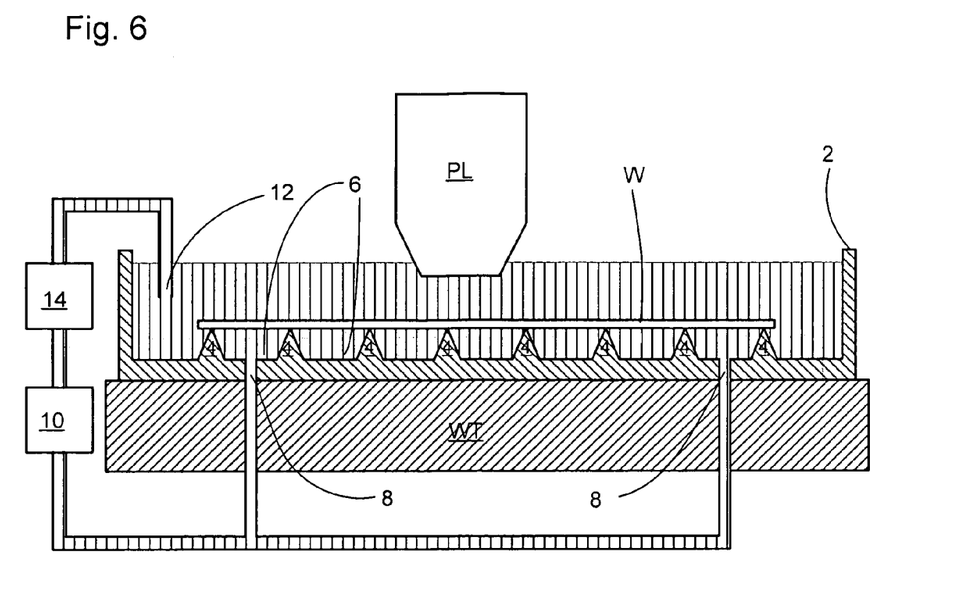
FIG. 6 illustrates a clamping system according to a first embodiment of the present invention.

FIG. 6 depicts a clamping system according to a first embodiment of the present invention. A substrate W is held on a chuck 2. The chuck 2 has a plurality of projections or pins 4 on a clamping surface which support the substrate W. These projections 4 are spaced evenly and project the same height above the clamping surface of the chuck 2.

The projections 4 spread the clamping force evenly over the substrate, reducing the possibility of the substrate deforming under the clamping force. A height of 1–2 mm is typical for the projections 4, but other heights in the range of 10 μm to 10 mm are also suitable and the height should be chosen to be optimized with respect to fluid flow such that the resulting pressure is evenly spread across the substrate and resulting in a flat surface. Although the projections 4 are depicted as pointed in FIG. 6, they could also have flattened tops. A number of arrangements of the projections are also possible, as well as the regular pattern used in this embodiment. The projection tops may be polished flat so that less than 1 μm variation in height exists.

The chuck 2 also has a raised perimeter rising from the clamping surface. This raised perimeter defines a space 6 which is filled with a liquid.

Two passages 8 are formed in the chuck 2 between the projections 4. The chuck 2 is mounted on the substrate table WT which has continuations of the passages 8 formed within it. Although two passages 8 are described, this need not be the case and any number of passages, for example one, three, four, five or more, can be provided.

A pump 10 is connected to the passages 8 and operates to remove liquid from the space 6 via the passages 8 and re-supply it to the space 6 via an inlet 12. This forms a closed circulation loop for the liquid.

In use, the space 6 is filled with liquid to a level sufficient to immerse at least the final element of the projection system PL in a liquid. This has the effect of creating a reservoir from which liquid can be pumped. The liquid is chosen so that it increases the effective numerical aperture of the projection system allowing smaller features to be imaged on the substrate. In this embodiment, the liquid is substantially distilled water, although other liquids which are at least partially transparent to radiation used in the projection system are also suitable.

To ensure that the liquid remains free from contaminants, the liquid is passed through a filter 14 as it is circulated by the pump 10.

This embodiment can be constructed through simple modifications to an immersion lithography apparatus. The substrate is clamped by the pressure differential created as the liquid is circulated by the pump 10 and/or by surface tension effects. Usually, the liquid used for immersion would be circulated to remove contaminants and ensure that the correct working temperature is maintained. Therefore, this embodiment allows the substrate to be clamped with only a small change to the liquid supply system. Furthermore, the clamping system used in this embodiment is unaffected by the immersion liquid, unlike a gas pressure system.

Although this embodiment has described an apparatus in which the entire substrate is immersed in liquid, it can also be applied to an apparatus which immerses only part of a substrate under the projection system PL in a liquid. As long as there is sufficient flow over the edge of the substrate to allow the liquid to be pumped by the pump 10 the substrate will still be clamped.

Figure 7:
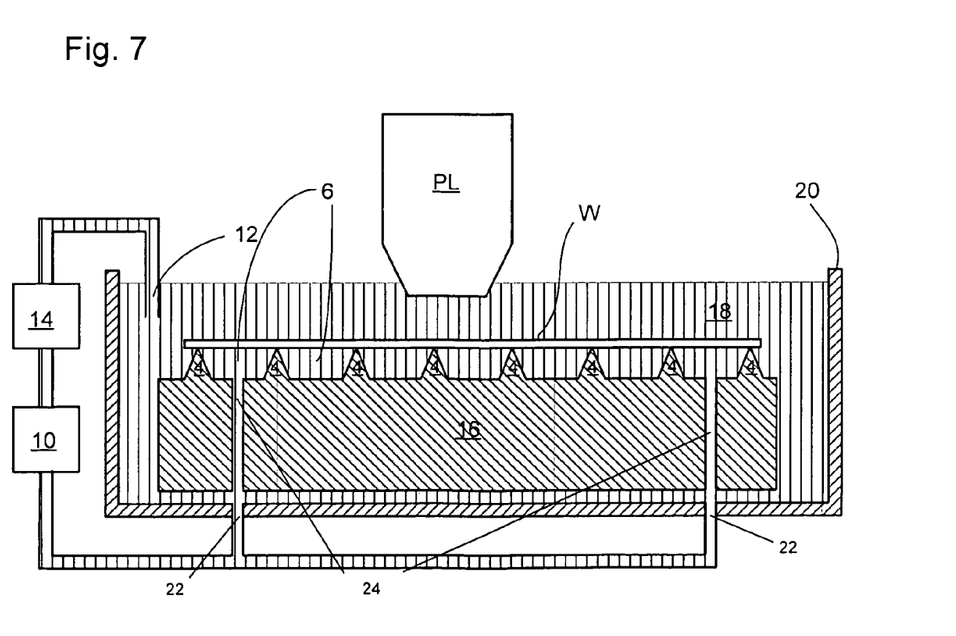
FIG. 7 illustrates a clamping system according to a second embodiment of the present invention.

FIG. 7 depicts a second embodiment of a clamping system according to the present invention. The construction of this embodiment is the same as for the first embodiment, except as described below.

In this embodiment the separate chuck 2 has been replaced by a single substrate table 16. The substrate table 16 has a number of projections 4 formed in the same manner as the chuck of the first embodiment, and performs the same function. It also has two passages 24 formed within it to allow liquid to flow through it.

The substrate table 16 sits in a space 18 defined by a separate liquid bath 20. The liquid bath 20 has a base and raised perimeter edges which define a space 18 sufficient to contain the substrate table 16 and which can retain liquid to a depth sufficient to immerse the final element of the projection system PL in the liquid. Passages 22 are formed in the base of the liquid bath 20 to allow liquid to be pumped from the space 18 by the pump 10.

Once again, the substrate is clamped by the pressure differential created by pumping liquid through the passages 22 and 24 and the substrate table 16. There is no requirement to accelerate the liquid when the substrate table is moved. Instead, the substrate table 16 is moved within the liquid filling the space 18.

Figure 8:
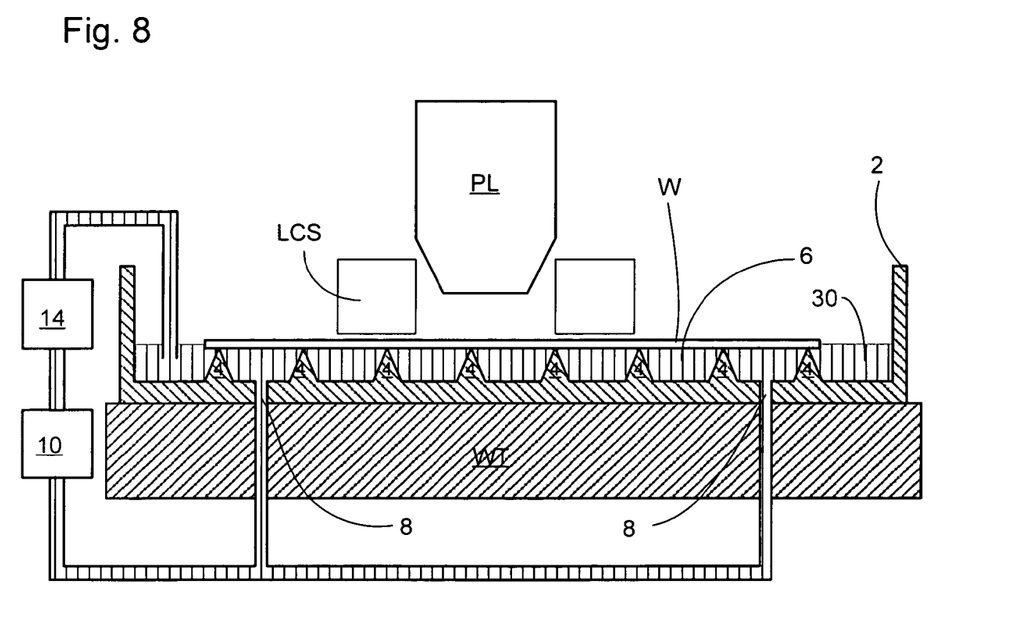
FIG. 8 illustrates a clamping system according to a third embodiment of the present invention.

FIG. 8 illustrates a third embodiment of the present invention. The construction of this embodiment is the same as for the first embodiment, save as described below. This embodiment is particularly suited to the localized liquid supply systems such as those mentioned herein because the edge of the substrate can easily be imaged as immersion liquid from the liquid supply system cannot leak around the edge of the substrate as liquid is already there (see 30 in FIG. 8). In this embodiment, the clamping liquid does not cover the top of the substrate W. Instead it covers only the lower surface of the substrate W which is in contact with the chuck. In this case, the substrate is clamped by the pressure and/or surface tension effects of the liquid sandwiched between the substrate and the chuck.

This embodiment allows the substrate to be clamped using liquid with no requirement for a flow of liquid from the top surface over the edge of the substrate. Therefore, this embodiment can be applied to localized area immersion apparatus which uses a liquid confinement system LCS without requiring the immersion liquid to flow over at least part of the edge of the substrate. It also allows the immersion and clamping liquids to be separated from each other and to be different. There may be no problem with the liquids mixing.

The projections 4 may need to be decreased in height in this embodiment in comparison to the other embodiments, for example to in the range of 5 to 20 μm. As with other embodiments, a reverse in the flow of liquid between the projections can be used to help remove the substrate W after imaging.

In a variation of the above embodiments, each of the gaps between projections 4 may form an inlet of a passage 8. Thus, the projection(s) has a complicated shaped upper surface with a surface area substantially equal to the surface area of the substrate, that is, the projection(s) is a flat surface with a few indentations in it which form inlets to the passages. The surface can be polished flat to have a maximum deviation of about 10 nm. Thus, the substrate can be held very flat on the clamping system.

In embodiments of the invention, a liquid is used to clamp the substrate to the chuck. In such a clamping system, the clamping force is provided by a liquid through pumping pressure and/or surface tension effects. Therefore, there is no difficulty in using the clamping system even if the substrate is immersed in a liquid. If the projection(s) is formed on the clamping surface then the substrate will be supported on the projection(s). This allows the clamping force to be evenly distributed across the substrate. It also allows the liquid to flow continually while the substrate is clamped because the projection(s) will maintain a small gap through which the liquid can flow even when the substrate is clamped. In an embodiment, less pressure may be exerted on the substrate than gas systems because of lower compressibility of the liquid. This may result in less deformation of the substrate.

In an embodiment, a passage is formed within the chuck, the passage having an opening on the clamping surface, and the pump is configured to pump liquid through the passage to create a pressure differential across the substrate. If the passage is formed in the chuck, the pump can pump liquid through the chuck, away from the clamping surface. This will create a pressure differential across a substrate in the clamping position and a resultant force which holds the substrate in place. This system has an advantage that the clamping liquid can also be used as the immersion liquid.

In an embodiment, the clamping system further comprises a filter configured to filter the liquid. The filter can remove contaminants from the liquid as it is circulated through the clamping system. This is particularly useful when the liquid used for the clamping system is also used for immersing the substrate.

In an embodiment, the pump is configured to pump the liquid into a reservoir to supplying the space so as to form a closed liquid circuit. If the liquid is pumped in a closed circuit, there may be no need for a continuous supply of liquid. In an embodiment, the construction may be simplified as one pump can pump liquid through all parts of the system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed:

1. A lithographic apparatus, comprising:
   a support configured to hold a patterning device, the patterning device configured to impart a beam of radiation with a pattern;
   a projection system configured to project the patterned beam of radiation onto a substrate;
   a table having a clamping surface, the clamping surface having one or more projections configured to support the substrate when clamped thereto; and
   a pump configured to pump a liquid through a space between the clamping surface and the substrate, so that when liquid is pumped through the space, the liquid in the space is at a lower pressure than fluid on an other side of the substrate such that a net force is exerted on the substrate to hold it on the clamping surface,
   wherein, during use, a level of the liquid is maintained to at least a lower surface of the substrate around at least part of a periphery of the substrate.

2. The apparatus according to claim 1, wherein the table has a passage within it, the passage having an opening on the clamping surface, and wherein the pump is configured to pump liquid through the passage to create a pressure differential across the substrate.

3. The apparatus according to claim 1, further comprising a filter configured to filter the liquid.

4. The apparatus according to claim 1, wherein the pump is configured to pump the liquid into a reservoir to supply the space so as to form a closed liquid circuit.

5. The apparatus according to claim 1, further comprising a controller configured to reverse the direction that the pump pumps the liquid.

6. The apparatus according to claim 1, comprising a liquid supply system configured to fill a space between the projection system and the substrate with a liquid.

7. The apparatus according to claim 6, wherein the liquid supply system is configured to supply the liquid to only a localized area on the substrate.

8. The apparatus according to claim 1, comprising a raised perimeter on or around the substrate table and configured to contain a level of the liquid sufficient to immerse a final element of a projection system used to transfer the pattern.

9. The apparatus according to claim 1, comprising a raised perimeter on or around the substrate table and an inlet to supply liquid to the space, both configured to keep a level of the liquid sufficient to cover only a lower surface of the substrate.

10. The apparatus according to claim 1, wherein the table has a plurality of projections and a plurality of passages between the projections and the pump is configured to pump liquid through the passages.

11. The apparatus according to claim 10, wherein the projections and passages are arranged to form a substantially evenly distributed pressure differential across the substrate.

12. A device manufacturing method, comprising:
    holding a substrate on a clamping surface of a table by providing a liquid in the space between the substrate and the clamping surface that is at a lower pressure than a fluid on an other side of the substrate;
    maintaining a level of the liquid in a container to at least a lower surface of the substrate around at least part of a periphery of the substrate; and
    transferring a pattern from a patterning device onto the substrate.

13. The method according to claim 12, comprising pumping the liquid through a passage in the table, the passage having an opening on the clamping surface, so as to create a pressure differential across the substrate.

14. The method according to claim 12, further comprising filtering the liquid to remove contaminants.

15. The method according to claim 12, comprising pumping the liquid into a reservoir to supply the space so as to form a closed liquid circuit.

16. The method according to claim 12, further comprising reversing the direction that the pump pumps the liquid.

17. The method according to claim 12, comprising filling a space between a projection system used to transfer the pattern and the substrate with a liquid.

18. The method according to claim 17, comprising supplying the liquid to only a localized area on the substrate.

19. The method according to claim 12, comprising maintaining the level of the liquid sufficient to immerse a final element of a projection system used to transfer the pattern.

20. The method according to claim 12, comprising maintaining the level of the liquid sufficient to cover only a lower surface of the substrate.

21. The method according to claim 12, wherein the table has a plurality of projections and a plurality of passages between the projections and comprising pumping the liquid through the passages.

22. The method according to claim 21, wherein the projections and passages arranged to form a substantially evenly distributed pressure differential across the substrate.

* * * * *